(12) United States Patent
Stimson

(10) Patent No.: US 6,345,588 B1
(45) Date of Patent: *Feb. 12, 2002

(54) USE OF VARIABLE RF GENERATOR TO CONTROL COIL VOLTAGE DISTRIBUTION

(75) Inventor: Bradley O. Stimson, San Jose, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/908,341

(22) Filed: Aug. 7, 1997

(51) Int. Cl.[7] .............................................. C23C 16/00
(52) U.S. Cl. ............... 118/723 I; 156/345; 315/111.51; 204/298.34
(58) Field of Search .................... 118/723 I, 723 IR, 118/723 AN; 156/345; 315/111.51; 204/298.06, 298.08, 298.34

(56) References Cited

U.S. PATENT DOCUMENTS

| | | |
|---|---|---|
| 3,475,702 A | 10/1969 | Ainsworth |
| 3,569,777 A | 3/1971 | Beaudry |
| 3,594,295 A | 7/1971 | Meckel et al. |
| 3,675,093 A | 7/1972 | Russo et al. |
| 3,872,278 A | 3/1975 | Boom |
| 3,878,085 A | 4/1975 | Corbani |
| 4,229,826 A | 10/1980 | Wanzer |
| 4,272,743 A | 6/1981 | Evans |
| 4,284,490 A | 8/1981 | Weber |
| 4,336,118 A | 6/1982 | Patten et al. |
| 4,362,632 A | 12/1982 | Jacob |
| 4,441,092 A | 4/1984 | Thornton et al. |
| 4,626,312 A | 12/1986 | Tracy |
| 4,661,228 A | 4/1987 | Mintz |
| 4,712,112 A | 12/1987 | Carr |

(List continued on next page.)

FOREIGN PATENT DOCUMENTS

| | | |
|---|---|---|
| EP | 0520519 | 12/1992 |
| EP | 0607797 | 1/1994 |
| EP | 0714106 | 5/1996 |
| EP | 0774886 | 5/1997 |
| EP | 0782172 | 7/1997 |
| EP | 0791663 | 8/1997 |
| EP | 0801413 | 10/1997 |
| EP | 0836219 | 4/1998 |
| EP | 0878826 | 11/1998 |
| EP | 0878826 A2 | 11/1998 |

(List continued on next page.)

OTHER PUBLICATIONS

M. Yamashita, "Sputter Type High Frequency Ion Source for Ion Beam Deposition Apparatus," *Jap. J. Appl. Phys.,* vol. 26, pp. 721–727, 1987.

M. Yamashita, "Fundamental Characteristics of Built–in High Frequency Coil Type Sputtering Apparatus," *J. Vac. Sci. Technol.,* vol. A7, pp. 151–158, 1989.

S.M. Rossnagel et al., "Metal Ion Deposition from Ionized Magnetron Sputtering Discharge," *J. Vac. Sci. Technol.,* vol. B12, pp. 449–453, 1994.

(List continued on next page.)

*Primary Examiner*—Gregory Mills
*Assistant Examiner*—Luz L. Alejandro
(74) *Attorney, Agent, or Firm*—Konrad Raynes & Victor

(57) ABSTRACT

In a plasma deposition system for depositing a film of sputtered target material on a substrate, the output of an RF generator coupled to a coil for generating a plasma can be varied during the deposition process so that heating and sputtering of the RF coil can be more uniform by "time-averaging" RF voltage distributions along the RF coil.

30 Claims, 5 Drawing Sheets

U.S. PATENT DOCUMENTS

| | | | |
|---|---|---|---|
| 4,716,491 A | 12/1987 | Ohno et al. | |
| 4,792,732 A | 12/1988 | O'Loughlin | |
| 4,842,703 A | 6/1989 | Class et al. | |
| 4,844,775 A | 7/1989 | Keeble | |
| 4,865,712 A | 9/1989 | Mintz | |
| 4,871,421 A | 10/1989 | Ogle et al. | |
| 4,902,394 A | 2/1990 | Kenmotsu et al. | |
| 4,918,031 A | 4/1990 | Flamm et al. | |
| 4,925,542 A | 5/1990 | Kidd | |
| 4,941,915 A | 7/1990 | Matsuoka et al. | |
| 4,948,458 A | 8/1990 | Ogle | |
| 4,990,229 A | 2/1991 | Campbell et al. | |
| 4,999,096 A | 3/1991 | Nihei et al. | |
| 5,057,185 A | 10/1991 | Thomas, III et al. | |
| 5,065,698 A | 11/1991 | Koike | |
| 5,091,049 A | 2/1992 | Campbell et al. | |
| 5,122,251 A | 6/1992 | Campbell et al. | |
| 5,135,629 A | 8/1992 | Sawada et al. | |
| 5,146,137 A | 9/1992 | Gesche et al. | |
| 5,175,608 A | 12/1992 | Nihei et al. | |
| 5,178,739 A | 1/1993 | Barnes et al. | |
| 5,195,045 A | 3/1993 | Keane et al. | |
| 5,206,516 A | 4/1993 | Keller et al. | |
| 5,225,740 A | 7/1993 | Ohkawa | |
| 5,231,334 A | 7/1993 | Paranjpe | |
| 5,234,560 A | 8/1993 | Kadlec et al. | |
| 5,241,245 A | 8/1993 | Barnes et al. | |
| 5,280,154 A | 1/1994 | Cuomo et al. | |
| 5,292,393 A | 3/1994 | Maydan et al. | |
| 5,304,279 A | 4/1994 | Coultas et al. | |
| 5,312,717 A | 5/1994 | Sachdev et al. | |
| 5,346,578 A | 9/1994 | Benzing et al. | |
| 5,361,016 A | 11/1994 | Ohkawa et al. | |
| 5,364,522 A * | 11/1994 | Wang | 205/50 |
| 5,366,590 A | 11/1994 | Kadomura | |
| 5,368,685 A | 11/1994 | Kumihashi et al. | |
| 5,392,018 A | 2/1995 | Collins et al. | |
| 5,397,962 A | 3/1995 | Moslehi | |
| 5,401,350 A | 3/1995 | Patrick et al. | |
| 5,404,079 A | 4/1995 | Ohkuni et al. | |
| 5,418,431 A | 5/1995 | Williamson et al. | |
| 5,421,891 A | 6/1995 | Campbell et al. | |
| 5,424,691 A | 6/1995 | Sadinsky | |
| 5,429,070 A | 7/1995 | Campbell et al. | |
| 5,429,710 A | 7/1995 | Akiba et al. | |
| 5,429,995 A | 7/1995 | Nishiyama et al. | |
| 5,430,355 A | 7/1995 | Paranjpe | |
| 5,473,291 A | 12/1995 | Brounley | |
| 5,503,676 A | 4/1996 | Shufflebotham et al. | |
| 5,540,800 A | 7/1996 | Qian | |
| 5,569,363 A | 10/1996 | Bayer et al. | |
| 5,571,366 A * | 11/1996 | Ishii et al. | 156/345 |
| 5,573,595 A | 11/1996 | Dible | |
| 5,585,766 A | 12/1996 | Shel | |
| 5,589,224 A | 12/1996 | Tepman et al. | |
| 5,591,493 A * | 1/1997 | Paranjpe et al. | 427/569 |
| 5,614,055 A | 3/1997 | Fairbairn et al. | |
| 5,639,357 A | 6/1997 | Xu | |
| 5,643,364 A | 7/1997 | Zhao et al. | |
| 5,688,357 A * | 11/1997 | Hanawa | 156/345 |
| 5,689,215 A | 11/1997 | Richardson et al. | |
| 5,716,451 A * | 2/1998 | Hama et al. | 118/723 |
| 5,759,280 A | 6/1998 | Holland et al. | |
| 5,793,162 A | 8/1998 | Barnes et al. | |
| 5,795,429 A | 8/1998 | Ishii et al. | |
| 5,800,619 A | 9/1998 | Holland et al. | |
| 5,800,688 A | 9/1998 | Lantsman et al. | |
| 5,803,977 A | 9/1998 | Tepman et al. | |
| 5,851,600 A * | 12/1998 | Horiike et al. | 427/535 |
| 5,874,704 A | 2/1999 | Gates | |
| 5,902,461 A | 5/1999 | Xu et al. | |
| 5,951,775 A | 9/1999 | Tepman et al. | |
| 5,961,793 A | 10/1999 | Ngan | |
| 6,023,038 A | 2/2000 | van Gogh | |

FOREIGN PATENT DOCUMENTS

| | | |
|---|---|---|
| GB | 2162365 | 1/1986 |
| GB | 2231197 | 11/1990 |
| JP | 59190363 | 10/1984 |
| JP | 61190070 | 8/1986 |
| JP | 6232055 | 8/1994 |
| JP | 6283470 | 10/1994 |
| JP | 7176399 | 7/1995 |
| JP | 8153712 | 6/1996 |
| JP | 8288259 | 11/1996 |
| WO | WO860623 | 11/1986 |
| WO | 9207969 | 5/1992 |
| WO | 9214258 | 8/1992 |
| WO | 9724748 | 7/1997 |
| WO | WO9724748 | 7/1997 |
| WO | WO997913 | 2/1999 |
| WO | 9907913 | 2/1999 |
| WO | 9950884 | 10/1999 |

OTHER PUBLICATIONS

S.M. Rossnagel et al., "Magnetron Sputter Deposition with High Levels of Metal Ionization," *Appl. Phys. Lett.,* vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.,* vol. B13, pp. 125–129, 1995.

Y–W. Kim et al., "Directed Sputter Deposition of AlCu: Film Microstructure and Chemistry," *J. Vac. Sci. Technol.,* vol. A12, pp. 3169–3175, 1994.

J. Hopwood et al., "Mechanisms for Highly Ionized Magnetron Sputtering," *J. Appl. Phys.,* vol. 78, pp. 758–765, 1995.

P. Kidd, "A Magnetically Confined and ECR Heated Plasma Machine for Coating and Ion Surface Modification Use," *J. Vac. Sci. Technol.,* vol. A9, pp. 466–473, 1991.

W.M. Holber, et al., "Copper Deposition by Electron Cyclotron Resonance Plasma," *J. Vac. Sci. Technol.,* vol. A11, pp. 2903–2910, 1993.

S.M. Rossnagel, "Directional and Ionized Sputter Deposition for Microelectronics Applications," *Proc. of 3rd ISSP (Tokyo),* pp. 253–260, 1995.

M. Matsuoka et al., Dense Plasma Production and Film Deposition by New High–Rate Sputtering Using an Electric Mirror, *J. Vac. Sci. Technol.,* A 7 (4), 2652–2657, Jul./Aug. 1989.

N. Jiwari et al., "Helicon wave plasma reactor employing single–loop antenna," *J. of Vac. Sci. Technol.,* A 12(4), pp. 1322–1327, Jul./Aug. 1994.

PCT Search Report issued on Jul. 22, 1999 in PCT/US99/06441.

EPO Search Report issued Jul. 22, 1999 in 98303794.6

Sansonnens, L., et al., A voltage uniformity study in large–area reactors for RF plasma deposition, Plasma Sources Sci. Technol. 6 (1977) 170–178.

EPO Search Report issued Aug. 13, 1999 in 98303813.4

PCT Search Report issued on Jul. 22, 1999 in PCT/US99/06441 (Atty. Ref. 7002PCT).

EPO Search Report issued on Aug. 13, 1999 in EP98303813 (Atty. Ref. 5317EP).

* cited by examiner

USE OF VARIABLE RF GENERATOR TO CONTROL COIL VOLTAGE DISTRIBUTION

FIELD OF THE INVENTION

The present invention relates to plasma generators, and more particularly, to a method and apparatus for generating a plasma to sputter deposit a layer of material or to etch a layer of material in the fabrication of semiconductor devices.

BACKGROUND OF THE INVENTION

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent the target impact the surface of the target to dislodge, i.e., "sputter" material from the target. The sputtered materials are then transported and deposited on the surface of the semiconductor wafer.

Sputtered material has a tendency to travel in straight line paths, from the target to the substrate, being deposited, at angles which are oblique to the surface of the substrate. As a consequence, materials deposited in etched openings, including trenches and holes of semiconductor devices having openings with a high depth to width aspect ratio, may not adequately coat the walls of the openings, particularly the bottom walls. If a large amount of material is being deposited, the deposited material can bridge over, causing undesirable cavities in the deposition layer. To prevent such cavities, sputtered material can be redirected into substantially vertical paths between the target and the substrate by negatively biasing (or self-biasing) the substrate and A positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density, in the range of $10^{11}$–$10^{13}$ ions/cm$^3$.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in a steady state. As shown in U.S. Pat. No. 4,362,632, for example, current through a coil is supplied by an RF generator coupled to the coil through an impedance-matching network, such that the coil acts as the first windings of a transformer. The plasma acts as a single turn second winding of a transformer.

Although ionizing the deposition material facilitates deposition of material into high aspect ratio channels and vias, many sputtered contact metals have a tendency to deposit more thickly in the center of the wafer as compared to the edges. This "center thick" deposition profile is undesirable in many applications where a uniform deposition thickness is needed.

As described in copending application Ser. No. 08/680, 335, entitled "Coils for Generating a Plasma and for Sputtering," filed Jul. 10, 1996 and assigned to the assignee of the present application, which application is incorporated herein by reference in its entirety, it has been recognized that the coil itself may provide a source of sputtered material to supplement the deposition material sputtered from the primary target of the chamber. Application of an RF signal to the coil can cause the coil to develop a negative bias which will attract positive ions which can impact the coil causing material to be sputtered from the coil. Because the material sputtered from the coil tends to deposit more thickly at the periphery of the wafer, the center thick tendency for material sputtered from the primary target can be compensated by the edge thick tendency for material sputtered from the coil. As a result, uniformity can be improved.

It has been recognized that the sputtering rate for material sputtered from the coil may be nonuniform around the perimeter of the coil. Hence the ability to achieve a desired level of uniformity may be adversely affected in some applications.

It has further been recognized that the coil can develop a hot spot which can cause uneven heating of the substrate. This uneven heating of the coil can also cause reliability problems in that portions of the coil may become too hot and deform, and may also cause particulates deposited on the coil to flake off and contaminate the substrate. Since single turn coils are typically required to carry a relatively high level of current, these problems can be more pronounced in such single turn coils.

As set forth in copending application Ser. No. 08/857,921, entitled "Use of Variable Impedance to Control Coil Sputter Distribution," filed May 16, 1997 and copending application Ser. No. 08/857,720, entitled "Use of Variable Impedance to Control Coil Sputter Distribution," filed May 16, 1997 and assigned to the assignee of the present application, which applications are incorporated herein by reference in their entirety, this "hot spot" on the coil may be shifted around the coil as the deposition progresses by repetitively changing one or more impedances coupled to the coil. As a result, the coil may be more uniformly heated and sputtered. However, changing the inductance of an inductor (or the capacitive of a capacitor) coupled to the coil may not be appropriate in some applications. Accordingly, a need exists for additional processes and apparatus which can improve the uniformity of deposition of ionized material onto a substrate.

SUMMARY OF THE PREFERRED EMBODIMENTS

These and other objects and advantages are achieved by a plasma generating apparatus in which, in accordance with one aspect of the invention, the output of an RF generator coupled to an RF coil is varied to shift RF voltage distributions along the length of the RF coil. It has been noted that the RF voltage distributions along the coil influence the plasma properties such as the plasma density and potential profiles and electron and ion movements including ion bombardment of the coil and substrate being deposited. It has further been noted that the instantaneous RF voltage distributions along the coil are not uniform or symmetric about the symmetry axis of the coil. These nonuniform and asymmetrical instantaneous RF voltage distributions along the coil can lead to nonuniform and asymmetrical heating of both the coil and the substrate as well as nonuniform sputtering of the coil and nonuniform deposition of material on the substrate.

In accordance with one aspect of the present invention, it is recognized that varying a parameter of the RF signal applied to the coil during a sputtering operation can move or vary the RF voltage distributions along the RF coil so that minima and maxima points of the RF voltage distribution along the coil are not fixed at particular regions of the coil. Instead, the RF voltage distribution can be repeatedly moved around the coil in a rotational or other motion. In addition, the ionization pattern of the plasma associated with the RF voltage distribution may be similarly moved in conjunction with the movement of the RF voltage distribution. As a consequence, the RF coil and substrate can be more uniformly and symmetrically heated, by time-averaging, because a "hot spot" of sputtering can be avoided. In addition, the coil itself may be more uniformly sputtered and the deposition material can be more uniformly deposited.

In one embodiment, the RF generator is programmed so that the frequency of the RF signal cyclically shifts to various frequencies. In an alternative embodiment the power level of the output is cyclically shifted. In this manner, the voltage distributions along the coil may be cyclically shifted to improve uniformity.

DETAILED DESCRIPTION OF THE DRAWINGS

Figure 1:
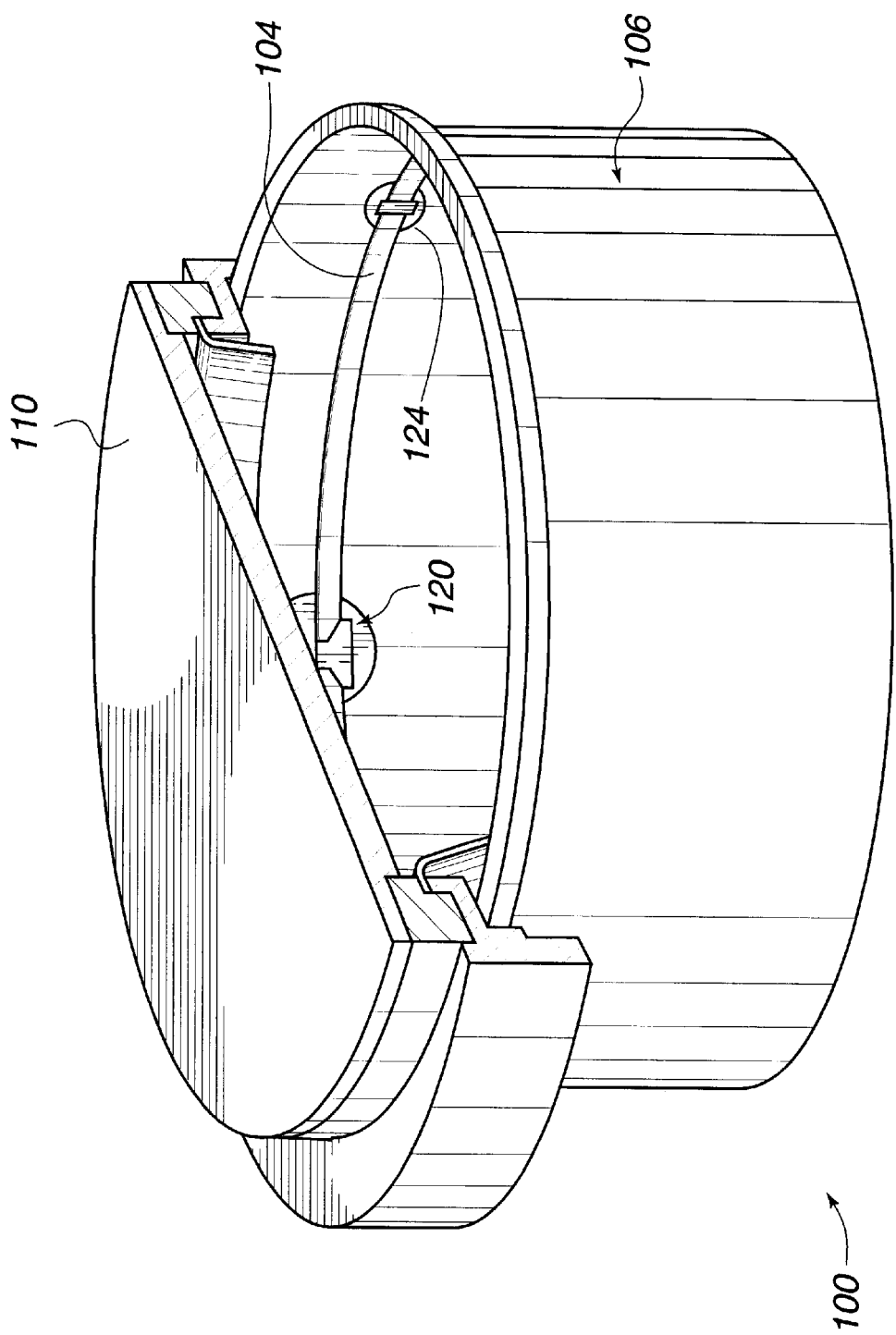
FIG. 1 is a perspective, partial cross-sectional view of a plasma generating chamber for sputter depositing a layer in a manner in accordance with an embodiment of the present invention.
Figure 2:
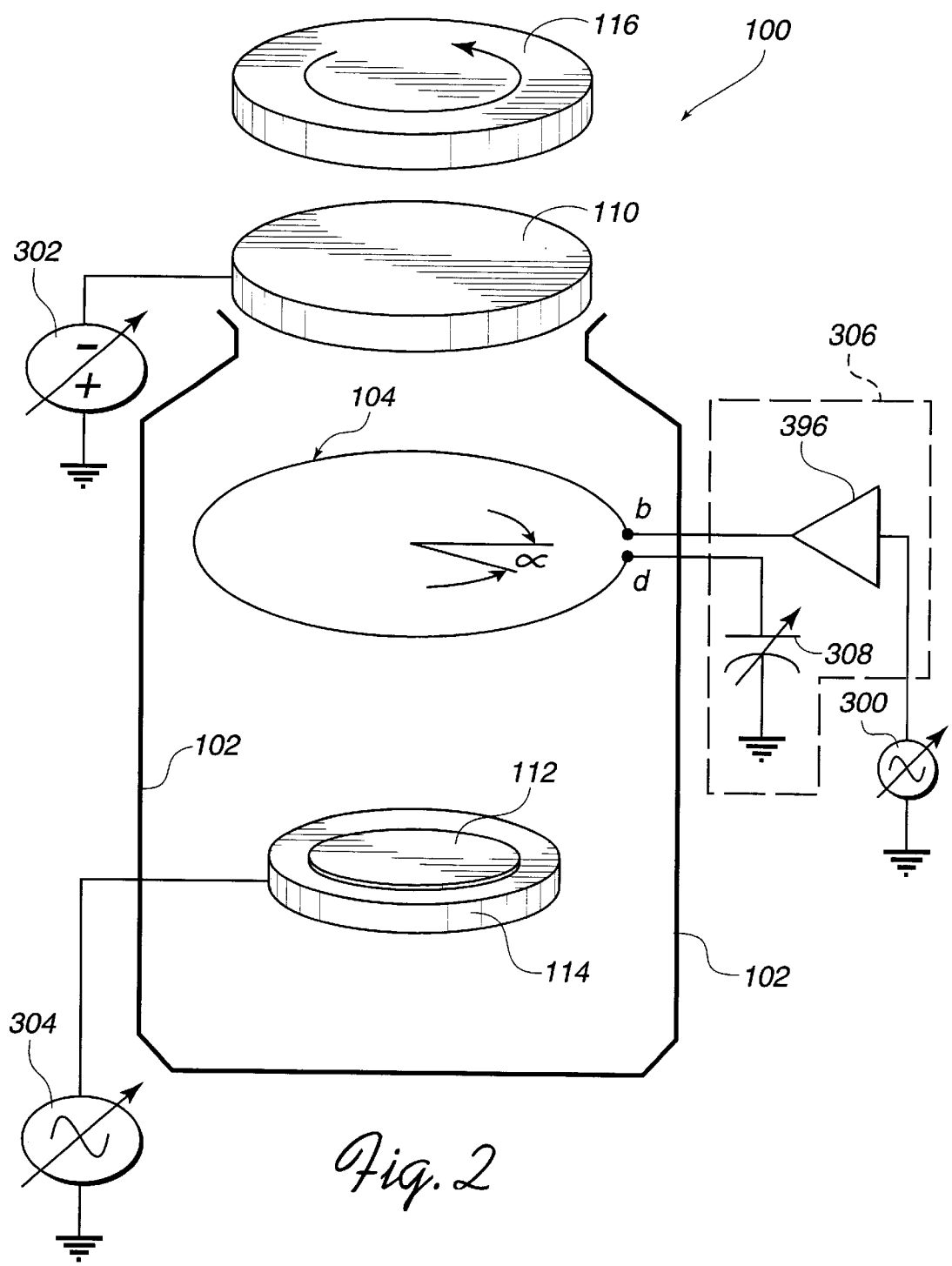
FIG. 2 is a schematic diagram of the electrical interconnections to the plasma generating chamber of FIG. 1.

Referring first to FIGS. 1–2, an example of a plasma generator used in accordance with an embodiment of the present invention comprises a substantially cylindrical plasma chamber 100 which is received in a vacuum chamber 102 (represented schematically in FIG. 2). The plasma chamber 100 of this embodiment has a single turn coil 104 which is carried internally of the vacuum chamber walls by a chamber shield 106 which protects the interior walls of the vacuum chamber 102 from the material being deposited within the interior of the plasma chamber 100. Radio frequency (RF) energy from an RF generator 300 (FIG. 2) is radiated from the coil 104 into the interior of the plasma chamber 100, which energizes a plasma within the plasma chamber 100. In accordance with one aspect of the present invention, the output of the RF generator 300 to coil 104 can be continuously or repeatedly modulated during a sputtering operation to cyclically shift or rotate the RF voltage distributions along the RF coil 104, and to shift the associated ionization of the plasma. As a consequence, the RF coil 104 and substrate 112 are more uniformly and axially symmetrically heated, and the deposition material is more uniformly sputtered from the coil, by time-averaging.

An ion flux strikes a negatively biased target 110 positioned above the plasma chamber 100. The plasma ions eject material from the target 110 onto a substrate 112 which may be a wafer or other workpiece supported by a pedestal 114 at the bottom of the plasma chamber 100. An optional rotating magnet assembly 116 may be provided above the target 110 to produce magnetic fields which sweep over the face of the target 110 to promote uniform erosion by sputtering of the target 110.

The deposition material sputtered from the target 110 passes through the plasma energized by the coil 104 prior to being deposited on the substrate 112. A portion of the deposition material passing though the plasma is ionized by the plasma. The ionized deposition material is then attracted to a negative potential on the substrate 112. In this manner, the ionized deposition material is redirected to a more vertical path which facilitates depositing more material into high aspect ratio openings in the substrate. Although the illustrated embodiment is described in connection with sputter deposition, it is contemplated that the present invention is useful in connection with etching and other semiconductor fabrication processes as well.

FIG. 2 includes a schematic representation of the electrical connections of the plasma generating apparatus of this illustrated embodiment. To sputter target material onto the substrate 112, the target 110 is preferably negatively biased by a variable DC power source 302 to attract the ions generated by the plasma. In the same manner, the pedestal 114 may be biased by a variable RF power source 304 to bias the substrate 112 negatively to attract the ionized deposition material to the substrate 112. In an alternative embodiment, the pedestal 114 may be biased by a high frequency AC power source to bias the substrate 112 so as to attract the ionized deposition material more vertically to the substrate 112. In yet another alternative embodiment, external biasing of the substrate 112 may be omitted.

One end b of the coil 104 is coupled to an RF source such as the output of an amplifier 396 and impedance-matching network 306, the input of which is coupled to the RF generator 300. The other end d of the coil 104 is coupled to ground, preferably through a capacitor 308, which may be a variable capacitor. The impedance-matching network 306 adjusts the combined impedances of the RF coil 104 and the network 306 to match the impedance of the RF generator 300 so that RF energy will be efficiently transmitted from the RF generator 300 to the RF coil 104 rather than being reflected back to the generator 300.

As set forth above, it has been noted that the RF voltage distributions along the coil 104 can influence various properties of the plasma. These plasma properties include the plasma density and potential profiles, and ion bombardment of the coil 104 and substrate 112 being deposited. Because the instantaneous RF voltage distributions along the coil 104 are not uniform and are not axially symmetric about the symmetry axis of the coil 104, nonuniform and asymmetrical heating of both the coil 104 and the substrate 112 can occur as well as nonuniform sputtering of the coil and deposition of material on the substrate 112. Thus, nonuniform and asymmetrical heating of the coil 104 can cause reliability problems, in that portions of the coil 104 may become too hot and deform, and may also lead to the flaking of particulates deposited on the coil 104 which can contaminate the substrate 112. The nonuniform and asymmetrical instantaneous RF voltage distributions along the coil 104 and the consequent nonuniform effects can be most prominent when the coil 104 is a single turn coil. In accordance with the present invention, the frequency of the RF signal supplied by the RF generator 300 to the RF coil 104 can be repeatedly changed or tuned in repeating cycles during a sputtering operation to vary or move the RF voltage distributions along the RF coil 104, and thereby also rotate the ionization profile of the plasma about the coil axis. As the voltage profile is varied to continuously move the minimum, peak or other reference points of the voltage around the coil in an orbital or other path about the plasma region, the regions of plasma having varying ionization fractions, or rates may in effect rotate about an axis within the plasma region. As a consequence, the RF coil 104 and substrate 112 can be more uniformly and axially symmetrically heated, and the target and coil material can be more uniformly deposited, by time-averaging, because the regions of highest to lowest ionization fraction (or plasma density) can more equally contribute to sputtering of the coil and target.

Figure 3:
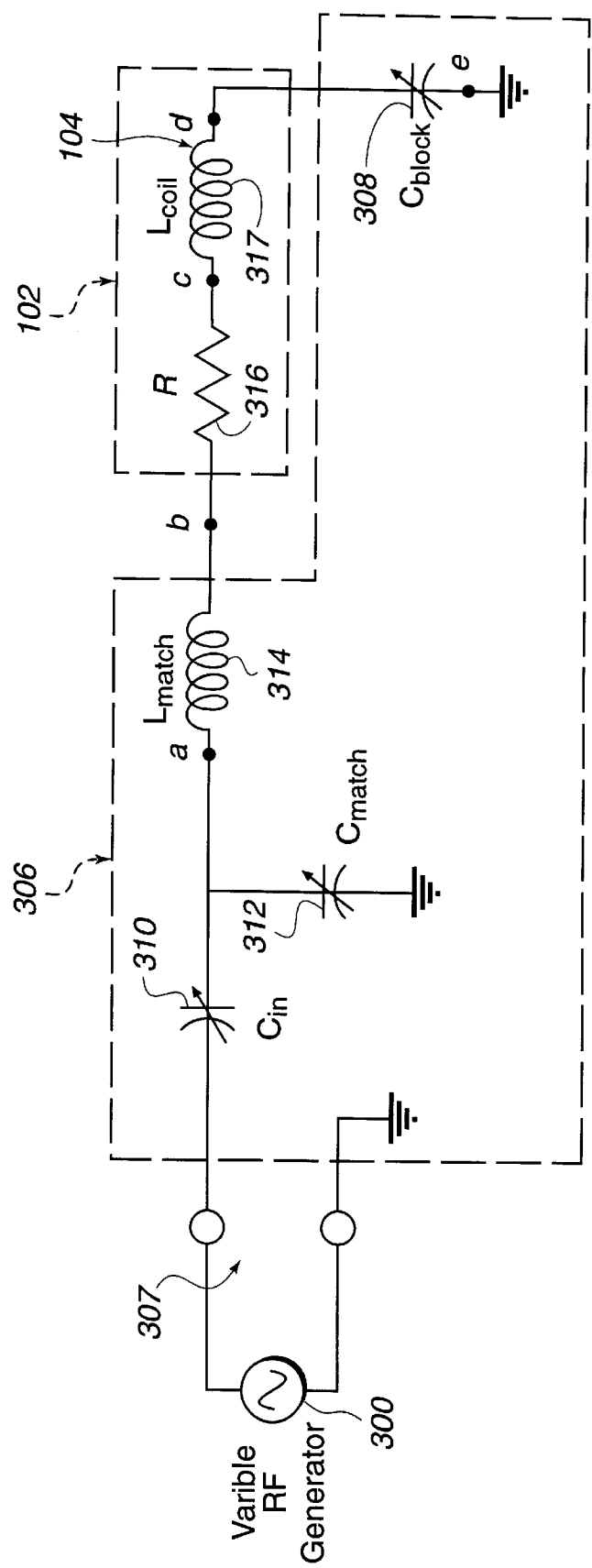
FIG. 3 is a schematic diagram according to one embodiment of the impedance-matching network and the plasma generating chamber of FIG. 2.

FIG. 3 is a schematic diagram illustrating one embodiment of an impedance-matching network 306 (excluding amplifier 396) having an input capacitor 310 with a variable capacitance $C_{in}$, a parallel match capacitor 312 with a variable capacitance $C_{match}$ and a series match inductor 314 with an inductance $L_{match}$ coupled through the vacuum chamber 102 to one end of the coil 104. A blocking capacitor 308 is coupled through the vacuum chamber 102 to the other end of the coil 104. The coil 104 has an associated inductance $L_{coil}$ and a resistance R as shown by an equivalent resistor 316 and inductor 317. The input of the impedance-matching network 306 is coupled to the RF generator 300 through RF input 307.

One function of the network 306 is to match the impedance of the coil 104 combined with that of the network 306 to the impedance of the RF generator 300 to minimize the reflection of RF energy back to the generator to maximize the coupling of RF energy from the coil 104 to the plasma in the chamber. Accordingly, for a particular coil impedance $L_{coil}$ of the coil 104, the values of the input capacitor 310, match capacitor 312, match inductor 314, and blocking capacitor 308, are chosen to provide a close match to the RF generator impedance which may be 50 ohms, for example. In a manner similar to that of prior impedance matching circuits, the impedances of the input capacitor $C_{in}$ and match capacitor $C_{match}$ may be finely tuned both prior to deposition and also during deposition to achieve and maintain a more precise match by adjusting the variable capacitances of the input capacitor 310 and match capacitor 312.

The value $C_{block}$ of the blocking capacitor 308 is chosen so as to DC isolate the coil from ground but to permit a return path to ground for the RF currents. However, in accordance with one aspect of the present invention, the impedance values of the blocking capacitor as well as the coil 104 may nonetheless be changed in repeating cycles by changing the frequency of the RF generator 300 during the deposition so as to cyclically shift the distribution of voltages around the coil 104 so as to increase the uniformity of sputtering rate and coil heating for each portion of the coil 104. This may be understood from the following:

The effective potential difference $V_{eff}$ between any two points of the alternating current (AC) series circuit from point a to point e in FIG. 3 equals the product of the effective current $I_{eff}$ and impedance Z of the AC circuit between the respective points.

The effective potential difference $V_{ab}$ between points a and b across series inductor 314 with an inductance $L_{match}$ is given by $$V_{ab} = I_{eff} Z_{ab} = IZ_{ab}$$

where the impedance $Z_{ab}$ across series inductor 314 with an inductance $L_{match}$ is given by $$Z_{ab} = \sqrt{R^2_{ab} + X^2_{ab}} = X_{L_{match}} = \omega L_{match}$$

where the inductive reactance $X_L$ of an inductor with inductance L is given by $X_L = \omega L$ where $\omega$ is the angular frequency of the instantaneous potential difference v given by $$v = V_{max}\sin(\omega t) = \sqrt{2}V_{eff}\sin(\omega t) = \sqrt{2}V_{eff}\sin(2\pi f t)$$

where f is the frequency (in Hertz) of the output signal of the RF generator 300 and where the instantaneous current i is given by $$i = I_{max}\sin(\omega t - \Phi) = \sqrt{2}I_{eff}\sin(\omega t - \Phi) = \sqrt{2}I\sin(\omega t - \Phi)$$

and the phase angle $\Phi_{ab}$ between the instantaneous potential difference $V_{ab}$ and the instantaneous current i across series inductor 314 with an inductance $L_{match}$ is given by $$\phi_{ab} = \tan^{-1}\left(\frac{X_{ab}}{R_{ab}}\right) = \tan^{-1}\left(\frac{\omega L_{match}}{0}\right) = \tan^{-1}(+\infty) = +\frac{\pi}{2}$$

so that the instantaneous potential difference $V_{ab}$ across series inductor 314 leads the instantaneous current i in the series inductor 314 by 90° and the effective potential difference $V_{ab}$ is equal to $|\omega L_{match}|$ between points a and b across series inductor 314.

The effective potential difference $V_{bc}$ between points b and c across series resistor 316 with an effective resistance R is given by $$V_{bc} = Z_{bc}$$

where the impedance $Z_{bc}$ across series resistor 316 with an effective resistance R is given by $$Z_{bc} = \sqrt{R^2_{bc} + X^2_{bc}} = R$$

where the phase angle $\Phi_{bc}$ between the instantaneous potential difference $V_{bc}$ and the instantaneous current i across series resistor 316 with an effective resistance R is given by $$\phi_{bc} = \tan^{-1}\left(\frac{X_{bc}}{R_{bc}}\right) = \tan^{-1}\left(\frac{0}{R}\right) = \tan^{-1}(0) = 0$$

so that the instantaneous potential difference $v_{bc}$ across series resistor 316 is in phase with the instantaneous current i in the series resistor 316 and the effective potential difference $V_{bc}$ is equal to IR between points b and c across series resistor 316.

The effective potential difference $V_{cd}$ between points c and d across coil 104 with an inductance $L_{coil}$ is given by $$V_{cd} = IZ_{cd}$$

where the impedance $Z_{cd}$ across coil 104 with an inductance $L_{coil}$ is given by $$Z_{cd}\sqrt{R^2_{cd} + X^2_{cd}} = X_{L_{coil}} = \omega L_{coil}$$

where the phase angle $\Phi_{cd}$ between the instantaneous potential difference $v_{cd}$ and the instantaneous current i across coil 104 with an inductance $L_{coil}$ is given by $$\phi_{cd} = \tan^{-1}\left(\frac{X_{cd}}{R_{cd}}\right) = \tan^{-1}\left(\frac{\omega L_{coil}}{0}\right) = \tan^{-1}(+\infty) = +\frac{\pi}{2}$$

so that the instantaneous potential difference $v_{cd}$ across coil 104 leads the instantaneous current i in the series inductor by 90° and the effective potential difference $V_{cd}$ is equal to $|\omega L_{coil}|$ between points c and d across coil 104.

The effective potential difference $V_{de}$ between points d and e across blocking variable capacitor 308 with a variable capacitance $C_{block}$ is given by $$V_{de} = I Z_{de}$$

where the impedance $Z_{de}$ across blocking variable capacitor 308 with a variable capacitance $C_{block}$ is given by $$Z_{de} = \sqrt{R_{de}^2 + X_{de}^2} = X_{C_{block}} = \frac{1}{\omega C_{block}}$$

where the capacitive reactance $X_c$ of a capacitor with capacitance C is given by $X_c = (\omega C)^{-1}$ and the phase angle $\Phi_{de}$ between the instantaneous potential difference $V_{de}$ and the instantaneous current i across blocking variable capacitor 308 with a variable capacitance $C_{block}$ is given by $$\phi_{de} = \tan^{-1}\left(\frac{X_{de}}{R_{de}}\right) = \tan^{-1}\left(\frac{-\frac{1}{\omega C_{block}}}{0}\right) = \tan^{-1}(-\infty) = -\frac{\pi}{2}$$

so that the instantaneous potential difference $V_{de}$ across blocking variable capacitor 308 lags the instantaneous current i in the blocking variable capacitor 308 by 90° and the effective potential difference $V_{de}$ is equal to $|(\omega C_{block})^{-1}|$ between points d and e across blocking variable capacitor 308.

For a given capacitance $C_{block}$ of the blocking capacitor 308, the frequency f, and hence the angular frequency ω of the RF generator 300, may be chosen so that the effective potential difference $V_{de} = |(\omega C_{block})^{-1}|$ between points d and e across blocking capacitor 308 is substantially equal to the effective potential difference $V_{cd} = |\omega L_{coil}|$ between points c and d across coil 104. The instantaneous potential difference $v_{de}$ across blocking capacitor 308 would then lag the instantaneous potential difference $v_{cd}$ across coil 104 by 180° and the instantaneous potential difference $V_{de}$ across blocking variable capacitor 308 consequently would be completely out of phase with the instantaneous potential difference $v_{cd}$ across coil 104. Ignoring the effect of any bias induced on the coil such as a substantially constant DC offset bias or a DC self-bias, the effective potential V vanishes (V=0) at point c so that a hypothetical voltmeter (not shown) measuring the potential differences between point c and point e would read zero.

Alternatively, the angular frequency ω of the RF generator 300 may be chosen so that the effective potential difference $V_{de} = |\omega C_{block})^{-1}|$ between points d and e across blocking variable capacitor 308 is substantially equal to half the effective potential difference $V_{cd=|\omega Lcoil|} = 2V_{de} = 2|(\omega C_{block})^{-1}|$ between points c and d across coil 104. The instantaneous potential difference $v_{de}$ across blocking variable capacitor 308 would again lag the instantaneous potential difference $V_{cd}$ across coil 104 by 180° and the instantaneous potential difference $V_{de}$ across blocking variable capacitor 308 consequently would again be completely out of phase with the instantaneous potential difference $V_{cd}$ across coil 104. Again, ignoring for the moment any DC offset bias or a DC self-bias, the effective potential V vanishes (V=0) at a point along the coil 104 substantially halfway between point c and point d so that a hypothetical voltmeter (not shown) placed between the point (substantially halfway between point c and point d) and point e would read zero.

Similarly, the angular frequency ω of the RF generator 300 may be chosen so that the effective potential difference $V_{de} = |(\omega C_{block})^{-1}|$ between points d and e across blocking variable capacitor 308 is substantially equal to $n^{-1}$ times the effective potential difference $V_{cd} = |\omega L_{coil}| = nV_{de} = n|(\omega C_{block})^{-1}|$ between points c and d across coil 104, where n is any positive real number. The instantaneous potential difference $v_{de}$ across blocking variable capacitor 308 would again lag the instantaneous potential difference $v_{cd}$ across coil 104 by 180° and the instantaneous potential difference $V_{de}$ across blocking variable capacitor 308 consequently would again be completely out of phase with the instantaneous potential difference $v_{cd}$ across coil 104. It is believed that the effective potential V vanishes (V=0) at a point along the coil 104 substantially $(n-1)n^{-1}$ of the way between point c and point d so that a voltmeter (not shown) between the point (substantially $(n-1)n^{-1}$ of the way between point c and point d) and point e would read zero. In the limit that n becomes very large, the point where the effective potential V vanishes (V=0) along the coil 104 approaches arbitrarily close to point d.

Alternatively, the angular frequency ω of the RF generator 300 may be chosen so that the effective potential difference $V_{de=|(\omega Cblock)}n^{-1}$ between points d and e across blocking variable capacitor 308 is substantially equal to $(n-1)n^{-1}$ times the effective potential difference $V_{cd} = |\omega L_{coil}| = (n-1)^{-1}nV_{de} = (n-1)^{-1}n|(\omega C_{block})^{-1}|$ between points c and d across coil 104, where n is any positive real number. The instantaneous potential difference $v_{de}$ across blocking variable capacitor 308 would again lag the instantaneous potential difference $v_{cd}$ across coil 104 by 180° and the instantaneous potential difference $v_{de}$ across blocking variable capacitor 308 consequently would again be completely out of phase with the instantaneous potential difference $v_{cd}$ across coil 104. Ignoring any DC offset bias or a DC self-bias, the effective potential V vanishes (V=0) at a point along the coil 104 substantially $n^{-1}$ of the way between point c and point d so that a voltmeter (not shown) between the point (substantially $^{-1}$ of the way between point c and point d) and point e would read zero. In the limit that n becomes very large, the point where the effective potential V vanishes (V=0) along the coil 104 approaches arbitrarily close to point c.

The above examples demonstrate that the output frequency f, and hence the angular frequency ω of the RF generator 300 may be chosen so that the effective potential V may be made to vanish (V=0) at any point along the coil 104 between point c and point d. This ability to vary over time the point along the coil 104 at which the effective potential V vanishes (V=0) may be used to shift the RF voltage distributions along the coil 104, and to shift the ionization of the plasma. As a consequence, the coil 104 and substrate 112 can be more uniformly and axially symmetrically heated, and the material sputtered from the target 110 can be more uniformly ionized and deposited, by time-averaging, on the substrate 112.

It is believed that the level of the DC bias on the coil is constant around the circumference of the coil and therefore will be axially symmetric. Thus, although the DC bias level is not a function of coil radial position, it is believed that the DC bias level for the coil will vary as the RF voltage distribution shifts. More specifically, it is believed that the plasma effectively averages the RF voltage distribution on the coil and rectifies it to induce a DC self bias onto the coil. Thus, as the frequency or other RF generator output is modulated, the particular DC bias level for the coil will vary.

Figure 4:
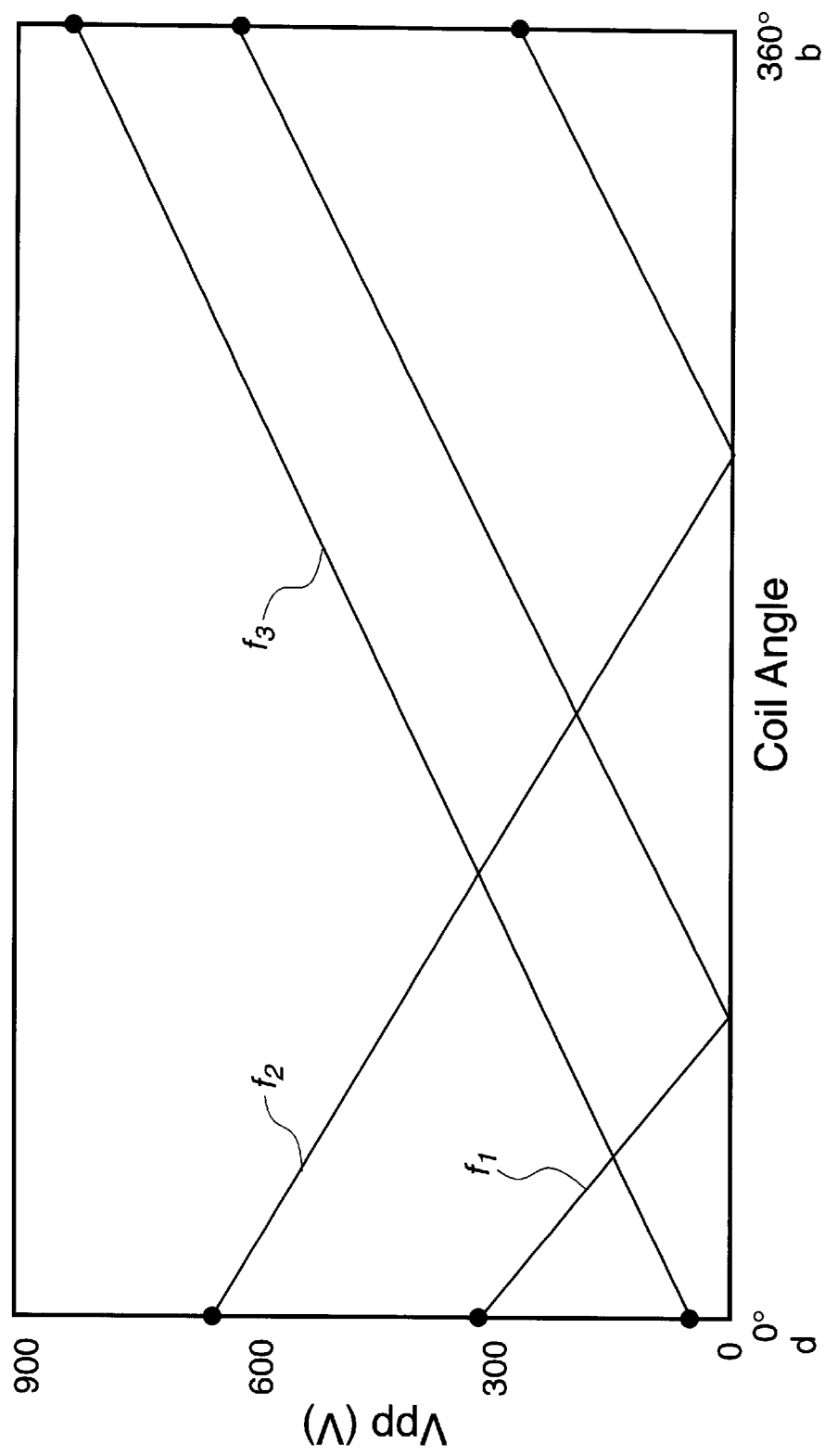
FIG. 4 is a graph depicting shifts in RF voltage distribution along a coil as a function of RF generator frequency change.

FIG. 4 is a graph depicting one example of how the RF voltage distributions may shift along the coil as the frequency f of the RF generator 300 is changed during deposition. In FIG. 4, the distributions of peak to peak RF voltage $V_{pp}$ on the coil 104 are shown as a function of position on the one turn coil 104 represented by coil angle α (FIG. 2) in which coil angle α=0° corresponds to end d (FIG. 3) of the coil and coil angle α=360° corresponds to end b of the coil 104 at which the RF feedthroughs are coupled to the coil. The voltage values depicted for the coil locations (0°<α<360°) are expected values rather than measurements for a single turn coil 104 having an inductance of 700 nanohenries and a blocking capacitor 308 having capacitance of 0.01 μf.

In one distribution, when the frequency f of the RF generator 300 has a value of $f_1$, the peak to peak RF voltage $V_{pp}$ at end α=0° may start at 300 volts and is believed to decrease to 0 volts at approximately coil location α=90°. The RF voltage then increases at succeeding locations around the coil until the other end b of the coil (α=360°) is reached where the peak to peak RF voltage has a value of approximately 600 volts. Because the peak to peak voltage is greatest at the coil location corresponding to coil angle α=360°, a hot spot may develop at that point. However, if in accordance with the present invention, the frequency f of the RF generator 300 is changed to another value while the deposition is proceeding, the hot spot may be shifted.

Thus, if the frequency f of the RF generator 300 is changed to a value of $f_2$, for example, the voltage distribution can shift in this example so that the distribution is effectively reversed as shown. More specifically, at this frequency the peak to peak RF voltage $V_{pp}$ at end α=0° may start somewhat above 600 volts and is believed to continuously decrease at succeeding locations around the coil until coil location a~240° is reached where $V_{pp}$ is believed to be equal to 0 volts. The RF voltage then increases until the other end b of the coil (α=360°) is reached where the peak to peak RF voltage has a value of approximately 300 volts. Accordingly, the hot spot will shift to the other end of the coil at coil angle α=0°. By appropriately changing the frequency f of the RF generator 300 as the deposition proceeds, the hot spot may be shifted to intermediate positions along the coil circumference to more evenly distribute the hot spots and thus more evenly heat and sputter the coil.

As the voltage distribution is shifted, the maximum and minimum values along the coil can change as well. Thus, as shown in FIG. 4, if the frequency f of the RF generator 300 is changed to a value of $f_3$, for example, the voltage distribution will shift in this example so that the peak to peak RF voltage $V_{pp}$ at end α=0° may start at close to 0 volts and may continuously increase until the other end b of the coil (α=360) is reached where the peak to peak RF voltage has a value of approximately 800 volts. Accordingly, the maximum and minimum values of the voltage distribution may change as well as the locations of the maximum and minimum values as the impedance is changed as the deposition progresses to more evenly heat and sputter the coil.

It is anticipated that sweeping the frequency back and forth between minimum and maximum frequency values which differ by 500 KHz with a median frequency of 2 MHz, for example, and sweeping the frequency approximately ten times during a 10 second sputtering deposition, for example, can provide satisfactory results. Of course, the manner in which the frequency of the RF generator is changed as the deposition progresses will vary depending upon the particular application. For example, rather than sweeping the frequency continuously through all values between two limits, it may be advantageous in some applications to shift the frequency among a number of different target values by skipping the intermediate frequency values between the target values. In such an arrangement, it is believed that the "hot spot" on the coil would likewise skip around the coil to locations corresponding to each target frequency. The frequencies may be selected in a sequential manner to shift the voltage distribution to various points in sequence along the coil 104 in repeating cycles as the deposition progresses. If the frequency values are selected in order of increasing (or decreasing) value, the coil voltage distribution will be rotated as each frequency is selected in turn. Alternatively, the frequency values may be selected in various orders or sequences in each cycle including random and pseudo-random sequences to shift the voltage distribution around the coil to achieve the desired coil heating or coil sputtering pattern on the coil 104. It is further anticipated that the frequency of the RF generator may be changed using a combination of sequences of discrete values and sweeps between values. In some applications it may be desirable to provide a pattern of coil heating and sputtering which is not evenly distributed around the coil to compensate for other sources of nonuniformity.

It is anticipated that the generator may be programmed to vary the frequency set point in a variety of patterns including repeating square wave, step and saw-tooth functions as well as sinusoidal functions and random functions. Also, the length of time at each frequency (i.e. the duty cycle) need not be uniform but may be varied depending upon the needs of the particular applications.

It is believed that a total change of 500 KHz in the frequency of the generator (which in the illustrated embodiment is about 25% of the central frequency of 2 MHz), is sufficient for many applications to rotate the RF voltage distributions along the entire length (360° of a one turn coil 104, and to rotate ionization pattern associated with the RF voltage distribution. The amount of impedance change required to rotate the voltage distribution will depend upon a number of factors including the number of turns of the sputtering coil 104 and the diameter of the coil 104.

It is contemplated that frequency changes having a lower maximum change may be used to achieve beneficial RF voltage and plasma ionization rotations or other movements. For example, a frequency change of 50 KHz may provide beneficial shifts. On the other hand, frequency changes having a maximum change substantially greater than 500 KHz may also be beneficial to improve uniformity.

In those applications where a high degree of impedance matching is desired, the impedance of the input capacitor 310 or the match capacitor 312 may be adjusted so as to maintain a good match as the frequency of the generator 300 is varied to rotate the voltage distributions around the coil 104. In addition, many RF generators have a load power regulation mode in which the power output may be regulated to maintain power output to the coil. If the level of reflected power rises beyond an acceptable limit as a consequence of a change to the generator frequency to shift the voltage distribution along the coil, the generator's load power can be regulated to increase the power output as the level of reflected power increases to restore the power level being applied to the coil.

Figure 5:
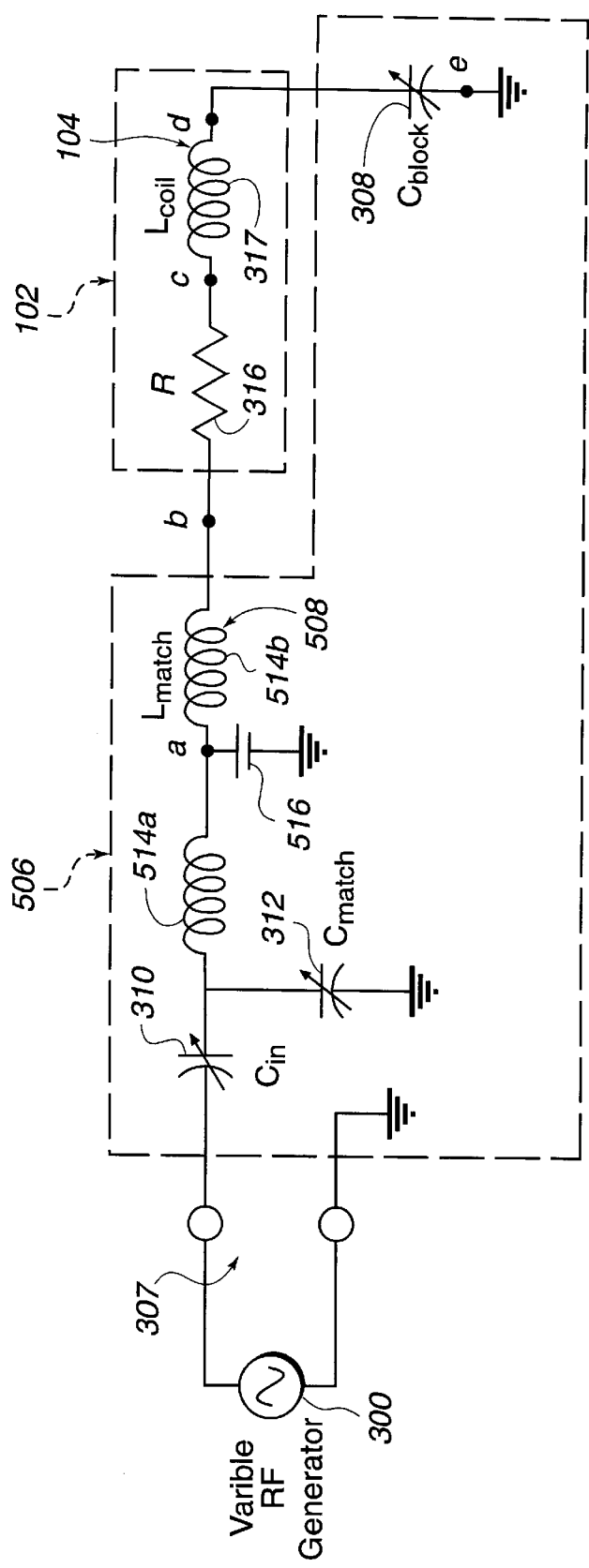
FIG. 5 is a schematic diagram according to another embodiment of the impedance-matching network and the plasma generating chamber of FIG. 2.

However, in some applications, the changes in frequency of the generator 300 may be of a magnitude for which the matching circuit may experience difficulty in quickly matching these changes to maintain good energy throughput to the coil 104. Also, the power losses may rise to undesirable levels. FIG. 5 is directed to another embodiment having a network 506 which may reduce the need for tuning the impedances of matching components or to regulate the power output in response to generator frequency changes for the purpose of shifting or rotating voltage distributions around the coil.

As shown in FIG. 5, the match inductor 314 of FIG. 3 has been replaced by a T-filter 508 comprising a pair of series coupled inductors 514a and 514b. Coupled between the two inductors 514a and 514b and ground is another match capacitor 516. Such a circuit arrangement is believed to provide the network 506 with a wider bandwidth (low Q) such that the network 506 and coil 104 can provide an acceptable match over a wider range of frequencies. Of course, other designs of the network are possible, depending upon the particular application.

In yet another alternative embodiment, instead of varying the frequency of the RF signal output to the coil 104 by the generator 300, the generator 300 may also be programmed to vary the power of the RF signal. It is believed that the impedance of the plasma maintained by the coil 104 is a nonlinear function of the power delivered to the coil 104. Furthermore, it is believed that the impedances and hence the resonant frequency of the coil 104 and the blocking capacitor 308 are in turn affected by the impedance of the plasma. Hence by varying the power delivered to the coil 104, it is believed that the plasma impedance will likewise be varied, causing the coil/capacitor resonant frequency to change and thereby shift the voltage distribution along the coil 104. As a consequence, any hot spot will also be moved around the coil, thereby reducing the length of time the hot spot is located at any one location on the coil. In addition, the hot spot may be moved to locations more evenly distributed around the coil. As a result, the temperature along the length of the coil may be more uniform. Furthermore, the overall temperature of the coil may be reduced.

Still further, as in the above described frequency shifting embodiment, it is believed that varying the power delivered to the coil to shift the voltage distributions along the coil may have a similar effect on sputtering patterns. Hence, if the voltage distribution present on the coil at a particular power level is nonuniform such that varying amounts of material are sputtered from the coil depending upon coil location, this sputtering pattern may likewise be shifted by varying the power delivered to the coil to improve sputtering uniformity.

The power delivered to the coil may be continually varied, sinusoidally for example, over a predetermined power range. This range may be selected such that the average power delivery is at a desired set point such as 1.5 kW, for example. In addition, the minimum power set point within the selected range is preferably high enough such that the plasma does not extinguish during the power variations. In a manner similar to that for frequency variation, it is anticipated that the generator may be programmed to vary the power set point in a variety of patterns including repeating square wave, step functions and saw-tooth functions as well as sinusoidal functions.

It is noted that the impedance matching provided by the network 306 or other suitable matching network may be affected by variations in the power supplied by the generator 300. In those applications where maintenance of the power delivered to the coil above a certain level is desired, operation of the generator in the load power regulation mode described above may be appropriate. In this mode, the generator can automatically vary the forward power so that the power delivered to the coil tracks the varying set point within the desired range of power set points.

As set forth above, it is believed that a total change of 500 KHz in the frequency of the generator, or 1.5 KW in the power output level, is sufficient to shift the voltage distribution a full 360° around the circumference of the coil each half cycle of the frequency sweep. Voltage distribution shifts over smaller portions of the coil circumference such as 270°, 180°, 90°, 45°, 30°, 15° and smaller may also be beneficial. Likewise, voltage distribution shifts on multi-turn coils which lap the coil circumference in whole or in part shifting the voltage distribution around more than one turn each cycle or half cycle of the frequency change are also believed to be beneficial. Thus, for example, a frequency shift which shifts from 1 MHz to 5 MHz may cause the voltage distribution to shift around a plurality of turns and hence around the circumference of the coil several times. Accordingly, the voltage distribution may shift an angular distance which is in excess of 360° each half cycle of the frequency or power shift.

It is anticipated that parameter changes in the generator output other than changes in frequency or power may be utilized to shift voltage distributions around the coil. For example, it may be beneficial in some applications to vary both the frequency and the power of the RF signal to the coil. In still other applications it is anticipated that the capacitance and the inductance of components of the matching circuit may be varied as set forth in the above referenced copending application Ser. No. 08/857,921 entitled "Use of Variable Impedance to Control Coil Sputter Distribution," filed May 16, 1997 and copending application Ser. No. 08/857,720, entitled "Use of Variable Impedance to Control Coil Sputter Distribution," filed May 16, 1997 and assigned to the assignee of the present application, incorporated by reference, in combination with varying the generator output. Such an arrangement may improve impedance matching performance while reducing the ranges of variation in both the generator output and inductor or capacitance values of the matching circuit.

The coil 104 is carried on the chamber shield 106 by a plurality of coil standoffs 120 (FIG. 1) which electrically insulate the coil 104 from the supporting chamber shield 106. In addition, the insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield 106. Such a completed conducting path is undesirable because it could short the coil 104 to the chamber shield 106 (which is typically grounded).

RF power is applied to the coil 104 by feedthrough bolts which are supported by insulating feedthrough standoffs 124. The feedthrough standoffs 124, like the coil support standoffs 120, permit repeated deposition of conductive material from the target onto the feedthrough standoff 124 without the formation of a conducting path which could short the coil 104 to the chamber shield 106. The coil feedthrough standoff 124, like the coil support standoff 120, has an internal labyrinth structure to prevent the formation of a short between the coil 104 and the wall of the shield 106. The feedthrough is coupled to the RF generator 300 (shown schematically in FIG. 2) through the impedance-matching network 306 (also shown schematically in FIG. 2).

As set forth above, the RF power radiated by the coil 104 energizes the plasma in the chamber to ionize the target material being sputtered from the target 110. The ionized sputtered target material is in turn attracted to the substrate 112 which is at a negative (DC or RF) potential to attract the ionized deposition material to the substrate 112.

In the illustrated embodiments discussed above, a single turn coil 104 was used, but, of course, multiple turn coils may be used instead. Still further, instead of the ribbon shape coil 104 illustrated, each turn of the coil 104 may be implemented with water cooled tubular helix or spiral shaped coils. Also, a flat, open-ended annular ring may be used as described in copending application Ser. No. 08/680, 335, entitled "Coils for Generating a Plasma and for Sputtering," filed Jul. 10, 1996 and assigned to the assignee of the present application, which application is incorporated herein by reference in its entirety.

Each of the embodiments discussed above utilized a single coil in the plasma chamber. It should be recognized that the present invention is applicable to plasma chambers having more than one RF powered coil or RF powered shields. For example, the present invention may be applied to multiple coil chambers for launching helicon waves of the type described in aforementioned copending application Ser. No. 08/559,345, filed Nov. 15, 1995 and entitled "Method And Apparatus For Launching a Helicon Wave in a Plasma".

The appropriate RF generators and matching circuits have components well known to those skilled in the art. For example, an RF generator such as the ENI Genesis series which has the capability to "frequency hunt" for the best frequency match with the matching circuit and antenna is suitable. The frequency range of the generator for generating the RF power to the coil 104 preferably includes a median frequency of 2 MHz but it is anticipated that the range can vary. For example, a range of frequencies within an overall range of 1 MHz to 20 MHz is believed suitable. A median RF power setting of 2.25 kW is preferred but a range of 1.5–5 kW is satisfactory. In addition, a DC power setting for biasing the target 110 of 8–12 kW is preferred but a wider range such as 2–24 kW may also be satisfactory, A pedestal 114 bias voltage of −30 volts DC is also suitable. Values for the above parameters will vary, depending upon the particular application.

A variety of sputtering gases may be utilized to generate the plasma including Ar, and a variety of reactive gases such as $NF_3$, $CF_4$, $H_2$, $O_2$ and many others may be used. Various sputtering gas pressures are suitable including pressures of 0.1–100 mTorr. For ionized PVD, a pressure between 10 and 50 mTorr often provides better ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A semiconductor fabrication system for processing a substrate, the system comprising:
    a semiconductor fabrication chamber having a plasma generation area within said chamber;
    a coil carried by said chamber and positioned to couple energy into said plasma generation area to maintain a plasma in said plasma generation area; and
    an RF generator coupled to said coil, said generator generating a cyclical RF signal having a variable frequency which shifts between at least three values in each cycle to time-average voltage distributions along said coil while said substrate is processed.

2. The system of claim 1 wherein said frequency shifts at least 50 KHz in each cycle during said process.

3. The system of claim 1 wherein said frequency shifts at least 500 KHz in each cycle during said process.

4. The system of claim 1 wherein said frequency values are defined by a periodic function.

5. The system of claim 4 wherein said periodic function is a sinusoid.

6. The system of claim 4 wherein said periodic function is a square wave.

7. The system of claim 4 wherein said periodic function includes a plurality of repeating cycles while said substrate is processed.

8. The system of claim 7 herein said periodic function includes at least 10 cycles.

9. The system of claim 1 wherein said processing includes sputter depositing onto said substrate and said coil is formed of deposition material for sputter deposition onto said substrate.

10. The system of claim 1 wherein said coil is carried internally within said chamber and said processing includes etching said substrate.

11. The system of claim 1 wherein said coil is carried within said chamber and is positioned to sputter material from said coil onto said substrate.

12. The system of claim 1 further comprising a blocking capacitor coupled to said coil.

13. A semiconductor fabrication system for sputtering material onto a substrate, the system comprising:
    a semiconductor fabrication chamber having a plasma generation area within said chamber;
    said chamber having a target of said material for sputtering;
    a coil of said material, carried by said chamber and positioned to couple energy into said plasma generation area to ionize said sputtered target material to form a layer of said sputtered target material on said substrate;
    an impedance-matching circuit coupled to said coil; and
    an RF generator coupled to said impedance matching circuit, said generator generating an RF signal having a cyclically variable frequency which shifts between at least three frequencies in each cycle for time-averaging voltage distributions along said coil.

14. A semiconductor fabrication system, comprising:
    a semiconductor fabrication chamber having a plasma generation area within said chamber;
    a coil carried by said chamber and positioned to couple energy into said plasma generation area to maintain a plasma in said plasma generation area, said coil having a plurality of voltage values distributed along said coil; and
    means coupled to said coil for generating an RF signal to said coil and for continuously shifting the frequency of said RF signal to continually shift said distribution of voltages along said coil.

15. The system of claim 14 herein said shifting means cyclically shifts said voltage distribution along said coil.

16. A semiconductor fabrication system, comprising:
    a semiconductor fabrication chamber having a plasma generation area within said chamber;
    a coil carried by said chamber and positioned to couple energy into said plasma generation area to maintain a plasma in said plasma generation area, said coil having a plurality of voltage values distributed along said coil;
    a generator for providing an RF signal to said coil; and
    means for changing a frequency of said RF signal so as to shift voltage distributions along said coil by an angular distance of at least 15°.

17. A semiconductor fabrication system for processing a substrate, the system comprising:
- a semiconductor fabrication chamber having a plasma generation area within said chamber;
- a coil carried within said chamber and positioned to couple RF energy into said plasma generation area to maintain a plasma in said plasma generation area;
- a blocking capacitor coupled between said coil and ground; and
- an RF generator coupled to said coil, said generator being constructed and adapted to generate an RF signal which causes said coil to have a plurality of voltage values distributed along said coil, said RF signal having a variable frequency, said RF generator being further constructed and adapted to shift said RF signal variable frequency between a plurality of values sufficiently different to shift said voltage value distribution in a predetermined path along said coil to thereby time-average voltage value distributions along said coil while said substrate is processed.

18. The system of claim 17 wherein said generator is further constructed and adapted to shift said RF signal variable frequency between a plurality of values in a predetermined sequence to shift a voltage value of said voltage value distribution to a plurality of points along said predetermined path of said coil in a predetermined sequence, the location of each point along said path being a function of the value of said RF signal frequency.

19. The system of claim 17 wherein said frequency values are defined by a periodic function.

20. The system of claim 19 wherein said periodic function is a sinusoid.

21. The system of claim 19 wherein said periodic function is a square wave.

22. The system of claim 19 wherein said periodic function is a saw-tooth.

23. The system of claim 19 wherein said periodic function is a step function.

24. The system of claim 19 wherein said periodic function includes a plurality of cycles while said substrate is processed.

25. The system of claim 19 wherein said periodic function includes at least 10 cycles.

26. The system of claim 24 wherein said generator is constructed and adapted to shift said RF signal variable frequency between a plurality of values sufficiently different to shift said voltage value distribution an angular distance of at least one of 15°, 30°, 45°, 90°, 180°, 270° and 360° along said predetermined path along said coil each cycle of said periodic function.

27. The system of claim 24 wherein said generator is constructed and adapted to shift said RF signal variable frequency between a plurality of values sufficiently different to shift said voltage value distribution in a rotational motion along said predetermined path along said coil each cycle of said periodic function.

28. The system of claim 24 wherein said coil encircles said plasma generation area and said generator is constructed and adapted to shift said RF signal variable frequency between a plurality of values sufficiently different to shift said voltage value distribution in an orbital motion along said predetermined path along said coil each cycle of said periodic function, wherein said predetermined path includes the entire circumference of said coil.

29. The system of claim 24 wherein said generator is constructed and adapted to sweep the frequency of said RF signal back and forth between at least two values to shift said voltage value distribution in a back and forth rotational motion along said predetermined path along said coil each cycle of said periodic function.

30. The system of claim 17 wherein said coil is a single turn coil.

* * * * *